(12) United States Patent
Tajitsu et al.

(10) Patent No.: US 9,804,041 B2
(45) Date of Patent: Oct. 31, 2017

(54) SENSOR DEVICE AND ELECTRONIC DEVICE

(71) Applicants: MURATA MANUFACTURING CO., LTD., Nagaokakyo-Shi, Kyoto-fu (JP); A School Corporation Kansai University, Suita-shi, Osaka (JP)

(72) Inventors: Yoshiro Tajitsu, Suita (JP); Masamichi Ando, Nagaokakyo (JP)

(73) Assignees: MURATA MANUFACTURING CO., LTD., Nagaokakyo-Shi, Kyoto-Fu (JP); A SCHOOL CORPORATION KANSAI UNIVERSITY, Suita-Shi, Osaka (JP)

(*) Notice: Subject to any disclaimer, the term of this patent is extended or adjusted under 35 U.S.C. 154(b) by 386 days.

(21) Appl. No.: 14/549,612

(22) Filed: Nov. 21, 2014

(65) Prior Publication Data

US 2015/0168237 A1 Jun. 18, 2015

Related U.S. Application Data

(63) Continuation of application No. PCT/JP2013/058447, filed on Mar. 23, 2013.

(30) Foreign Application Priority Data

May 24, 2012 (JP) .................................. 2012-118101

(51) Int. Cl.
*G01L 1/04* (2006.01)
*G01L 1/16* (2006.01)
(Continued)

(52) U.S. Cl.
CPC ................ *G01L 1/16* (2013.01); *G06F 3/041* (2013.01); *H01L 41/1132* (2013.01);
(Continued)

(58) Field of Classification Search
CPC . G01L 1/16; G06F 3/041; G06F 2203/04105; H01L 41/1132; H01L 41/193; H01L 41/0533
(Continued)

(56) References Cited

U.S. PATENT DOCUMENTS 8,084,925 B2* 12/2011 Shibata ............... H01L 41/1873
310/311
8,183,751 B2* 5/2012 Tajitsu .................. H01L 41/193
310/328
(Continued)

FOREIGN PATENT DOCUMENTS

EP 2442213 A1 * 4/2012 ............. G06F 3/046
EP 2442213 A1 4/2012
(Continued)

OTHER PUBLICATIONS

Japanese Office Action dated Nov. 17, 2015 issued for JP 2014-516699 (English translation of Japanese Office Action attached).
(Continued)

*Primary Examiner* — Max Noori
(74) *Attorney, Agent, or Firm* — Arent Fox LLP

(57) ABSTRACT

A sensor device that includes a film composed of, for example, PLLA; and electrodes for extracting an output voltage from the PLLA film. The electrodes are located on main surfaces of the PLLA film such that the electrodes face each other with at least a portion of the PLLA film being interposed therebetween. The PLLA film has a first side which is fixed, and a second side which is opposite to the first side and is a movable portion. Each of the electrodes is configured to extract an output voltage resulting from an effect of piezoelectric constant $d_{14}$ provided by shear deformation caused by displacement of the movable portion in a direction parallel to the main surfaces of the PLLA film,
(Continued)

whereby an operation involving friction or the like can be sensed.

15 Claims, 12 Drawing Sheets

(51) Int. Cl.
    *G06F 3/041*     (2006.01)
    *H01L 41/193*     (2006.01)
    *H01L 41/113*     (2006.01)
    *H01L 41/053*     (2006.01)

(52) U.S. Cl.
    CPC .. *H01L 41/193* (2013.01); *G06F 2203/04105* (2013.01); *H01L 41/0533* (2013.01)

(58) Field of Classification Search
    USPC ................................... 73/862.621, 841, 777
    See application file for complete search history.

(56) References Cited

U.S. PATENT DOCUMENTS

| | | | | |
|---|---|---|---|---|
| 9,276,191 B2* | 3/2016 | Ando | ..................... | G06F 3/0433 |
| 2010/0064804 A1* | 3/2010 | Kawakubo | ............. | G01C 19/56 |
| | | | | 73/504.03 |
| 2010/0253183 A1* | 10/2010 | Ando | ........................ | G01L 1/16 |
| | | | | 310/338 |
| 2011/0006383 A1 | 1/2011 | Shimoyama et al. | | |
| 2011/0109204 A1* | 5/2011 | Tajitsu | .................. | H01L 41/193 |
| | | | | 310/348 |
| 2011/0128245 A1* | 6/2011 | Andoh | .................. | H04R 17/005 |
| | | | | 345/173 |
| 2015/0153880 A1 | 6/2015 | Ando | | |
| 2016/0034073 A1* | 2/2016 | Andoh | .................... | G06F 3/046 |
| | | | | 345/174 |
| 2016/0153845 A1* | 6/2016 | Kawamura | ........... | H01L 41/047 |
| | | | | 73/862.629 |

FOREIGN PATENT DOCUMENTS

| | | |
|---|---|---|
| JP | 05-152638 | 6/1993 |
| JP | 2008-082947 A | 4/2008 |
| JP | 2009-070023 A | 4/2009 |
| JP | 2009-222415 A | 10/2009 |
| JP | 2009-222556 A | 10/2009 |
| JP | 2010-122018 A | 6/2010 |
| WO | WO-2009-139237 A1 | 11/2009 |
| WO | WO 2010/143528 A1 | 12/2010 |

OTHER PUBLICATIONS

PCT/JP2013/058447 ISR dated Apr. 30, 2013.
PCT/JP2013/058447 Written Opinion dated Apr. 30, 2013.

* cited by examiner $$\begin{pmatrix} 0 & 0 & 0 & d_{14} & 0 & 0 \\ 0 & 0 & 0 & 0 & d_{25} & 0 \\ 0 & 0 & 0 & 0 & 0 & d_{36} \end{pmatrix}$$

$$\begin{pmatrix} 0 & 0 & 0 & d_{14} & 0 & 0 \\ 0 & 0 & 0 & 0 & -d_{14} & 0 \\ 0 & 0 & 0 & 0 & 0 & 0 \end{pmatrix}$$

FIG.9(A)
FIG.9(B)
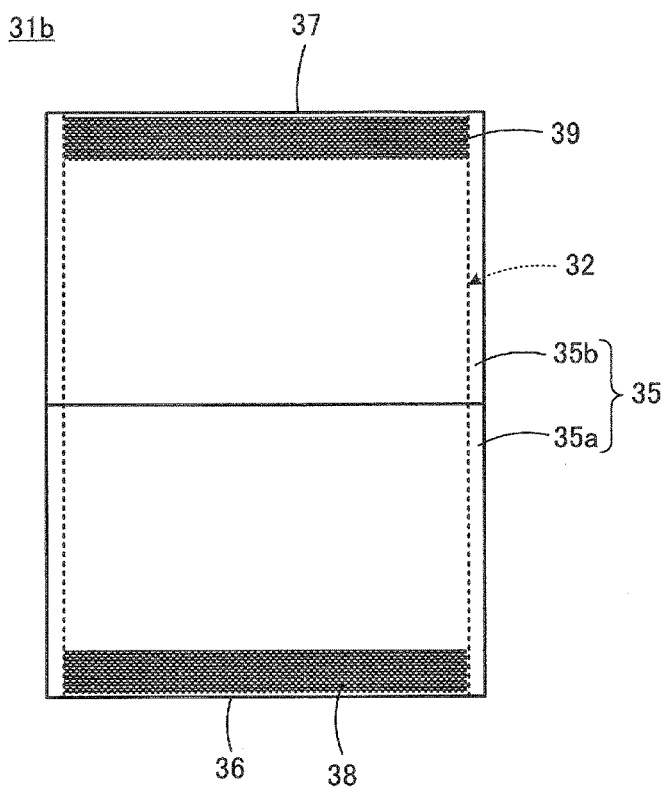
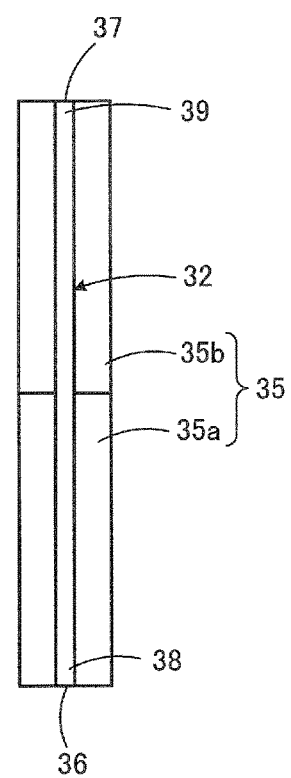

SENSOR DEVICE AND ELECTRONIC DEVICE

CROSS REFERENCE TO RELATED APPLICATIONS

The present application is a continuation of International application No. PCT/JP2013/058447, filed Mar. 23, 2013, which claims priority to Japanese Patent Application No. 2012-118101, filed May 24, 2012, the entire contents of each of which are incorporated herein by reference.

FIELD OF THE INVENTION

The present invention relates to a sensor device and an electronic device, in particular, a sensor device including a piezoelectric film composed of a chiral polymer as well as an electronic device constructed using the piezoelectric film.

BACKGROUND OF THE INVENTION

Japanese Patent Laying-Open No. 5-152638 (Patent Document 1) describes that a piezoelectric film having a piezoelectric constant $d_{14}$ is obtained by drawing a formed object of polylactic acid, for example. Specifically, as shown in FIG. 19, it is assumed that a piezoelectric film 11 composed of polylactic acid is provided with electrodes (not shown) respectively on its upper and lower surfaces in the figure, and has been drawn in an axial direction "3". When an electric field is applied in an axial direction "1", which is a direction normal to the electrode surfaces, shear strain is caused in an axial direction "4", which is a direction of rotation about axial direction "1". Such a piezoelectric property is generally referred to as a "shear piezoelectric property".

When the piezoelectric film composed of such polylactic acid is formed into a unimorph or bimorph structure, a piezoelectric device, such as a piezoelectric vibrator, can be obtained which is used for a speaker, a microphone, or the like. Patent Document 1 describes such general application but provides no specific description regarding its formation method, just reciting "in the case where the formed object thus drawn is a film, it is cut into an appropriate size to serve as a product" (paragraph[0018]).

PTD 1: Japanese Patent Laying-Open No. 5-152638

SUMMARY OF THE INVENTION

Accordingly, the present invention has an object to provide a sensor device constructed using a piezoelectric film composed of a chiral polymer such as polylactic acid.

The present invention has another object to provide an electronic device constructed using the sensor device, such as a mobile communication device, a tablet PC, or a portable gaming device.

The present invention is first directed to a sensor device including: a piezoelectric film, which contains as a main component a chiral polymer including chiral molecules as a unit and in which a main orientation direction of the chiral molecules is directed to a direction parallel to main surfaces thereof; and electrodes for extracting an output voltage from the piezoelectric film, the electrodes being formed on the main surfaces of the piezoelectric film such that the electrodes face each other with at least a portion of the piezoelectric film being interposed therebetween. The present invention has the following features.

The piezoelectric film has a fixed portion at which displacement of the piezoelectric film is fixed and a movable portion displaced in the direction parallel to the main surfaces of the piezoelectric film. Further, as the electrodes, there is formed a shear deformation detecting electrode for extracting the output voltage resulting from shear deformation of the piezoelectric film caused by the displacement of the movable portion.

With such a configuration, the sensor device according to the present invention is characterized in that the shear deformation caused in the piezoelectric film is directly detected through an effect of piezoelectric constant $d_{14}$.

Preferably, the piezoelectric film is cut to have a rectangular shape having a side extending in parallel or substantially parallel with the main orientation direction of the chiral molecules, and the fixed portion is positioned along one of sides of the piezoelectric film having the rectangular shape. According to such a configuration, the piezoelectric effect based on piezoelectric constant $d_{14}$ can be exhibited more efficiently when shear deformation takes place in the piezoelectric film. It should be noted that in manufacturing the piezoelectric film, a drawing step is performed and the chiral molecules are normally oriented in the direction of drawing.

In the case described above, in a first preferred embodiment, the fixed portion is positioned along a first side of the piezoelectric film and the movable portion is positioned along a second side opposite to the first side. Accordingly, the main orientation direction of the chiral molecules can be directed to the direction in which the operator provides frictional force to the movable portion, whereby deformation similar to the deformation of the piezoelectric film caused by shear piezoelectricity can be caused in the piezoelectric film. Hence, shear deformation capable of exhibiting the piezoelectric effect based on piezoelectric constant $d_{14}$ most efficiently can be caused in the piezoelectric film.

In the sensor device according to the first preferred embodiment, it is preferable to provide an operation member for providing a portion to be touched by a finger of an operator when operating to displace the movable portion of the piezoelectric film with the finger. The operation member has a width size larger than a thickness of the piezoelectric film and is attached along the second side of the piezoelectric film. According to such a configuration, the operation is more facilitated and becomes more comfortable by such a relatively wide operation member, and the movable portion of the piezoelectric film is not directly rubbed by the operator's finger, so that the piezoelectric film itself is not worn out and durability of the piezoelectric film can be improved.

On the other hand, in a second preferred embodiment, the fixed portion is positioned along each of first and second sides of the piezoelectric film, the first and second sides being opposite to each other, and the movable portion is positioned at an intermediate portion between the first and second sides in the piezoelectric film. According to such a configuration, electric charges opposite in polarity can be respectively generated at the first side and second side when operating the movable portion to cause shear deformation in the piezoelectric film.

The sensor device according to the present invention preferably further includes a holding member for holding the piezoelectric film in a flat state. Accordingly, desired shear deformation can be caused in the piezoelectric film more securely.

In the second preferred embodiment described above, the piezoelectric film may be held in a folded state by a holding member with the piezoelectric film being curved at the intermediate portion between the first and second sides. According to this configuration, the intermediate portion at which the piezoelectric film is curved provides a relatively wide operation plane, whereby a special operation member is not required to implement a facilitated and comfortable operation.

When the piezoelectric film is held in the folded state as described above, it is preferable that: a protection film is adhered at least on an outer surface of a folded portion of the piezoelectric film so as to cause extension deformation at the movable portion of the piezoelectric film through a bimorph effect provided by the protection film and the piezoelectric film when the folded portion of the piezoelectric film is pressed externally; as the electrodes, there is further formed an extension/compression deformation detecting electrode for extracting an output voltage resulting from extension deformation or compression deformation at the movable portion of the piezoelectric film; and an elastic body is disposed at an inner circumferential side relative to the folded portion of the piezoelectric film.

According to the above-mentioned configuration, when rubbing the folded portion of the piezoelectric film along an edge line thereof, an output voltage resulting from shear deformation of the piezoelectric film can be extracted by the shear deformation detecting electrode, whereas when pressing the folded portion of the piezoelectric film, an output voltage resulting from extension deformation or compression deformation of the piezoelectric film can be extracted by the extension/compression deformation detecting electrode.

In the sensor device according to the present invention, the piezoelectric film is preferably composed of polylactic acid. The use of polylactic acid provides a piezoelectric film excellent in transparency. Moreover, the use of polylactic acid achieves a stable piezoelectric property and provides a sensor device inexpensively. Furthermore, polylactic acid is carbon neutral, is biodegradable, and therefore is preferable in terms of protection of earth environment.

Moreover, the present invention is also directed to an electronic device, such as a mobile communication device, a tablet PC, or a portable gaming device, in which the above-described sensor device is incorporated as an HMI (human machine interface). In such an electronic device, an operation mode such as scrolling of screen can be implemented when an operator performs a predetermined operation such as rubbing with a finger.

The sensor device according to the present invention is configured to directly detect shear deformation, which is caused in the piezoelectric film, by means of an effect of piezoelectric constant $d_{14}$, thereby attaining high detection efficiency. Further, according to the present invention, a sensor device having no pyroelectric property and therefore free from temperature drift can be implemented. Furthermore, the sensor device according to the present invention is different from one employing a capacitive method or the like, and therefore can be operated even by an operator who wears gloves.

BRIEF DESCRIPTION OF THE DRAWINGS

FIG. 9(A) is a front view and FIG. 9(B) is a right side view, each of which shows a sensor device 31b according to a third embodiment of the present invention.

DETAILED DESCRIPTION OF THE PREFERRED EMBODIMENTS

First, the following fully describes a reference technique to facilitate understanding of the principle of the present invention.

Polylactic acid (PLA) is a dehydration condensation polymer, and is obtained through ring opening polymerization of lactide, which is a cyclic dimer of lactic acid. Lactic acid includes asymmetric carbon, and therefore has chirality. Hence, for PLA, there are L-isomer and D-isomer, and respective polymers thereof are referred to as "poly-L-lactic acid (PLLA)" and "poly-D-lactic acid (PDLA)". The main chain of PLLA has a left-handed helical structure whereas the main chain of PDLA has a right-handed helical structure. Types of the L-isomer and D-isomer are determined depending on types of microorganisms, such as bacteria, used in a process of synthesis of lactic acid. Most of PLAs currently mass-produced and used are PLLA. Therefore, the description below is directed to PLLA.

Figures 1, 2A, 2B:
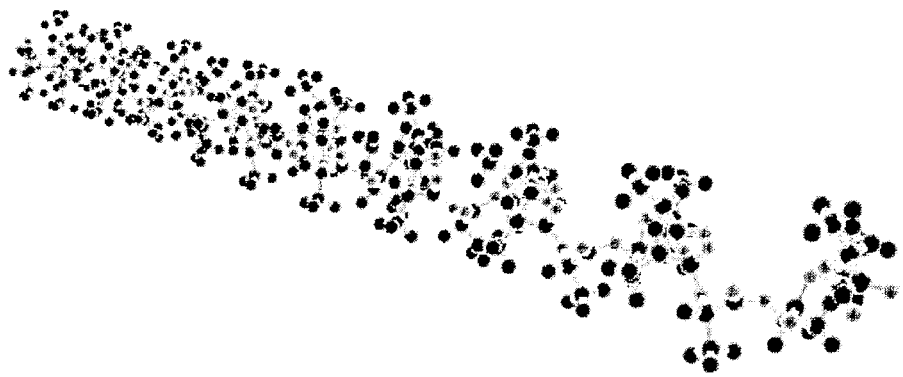
FIG. 1 schematically shows a state in which lactic acid molecules are dehydrated and polymerized into chiral molecules.
FIG. 2(A) shows piezoelectric tensor of a poly-L-lactic acid (PLLA) crystal.
FIG. 2(B) shows piezoelectric tensor of a PLLA film with uniaxial orientation.

PLLA is a chiral polymer as described above, and the helical structure of the main chain thereof is shown in FIG. 1. It is known that when a sheet of such PLLA is uniaxially drawn to orient molecules, it exhibits a piezoelectric property. Among polymers, PLLA has a very large piezoelectric constant. Since the point group of PLLA crystal is $D_2$, $d_{14}$, $d_{25}$, and $d_{36}$ are components of piezoelectric tensor as shown in FIG. 2(A), thus exhibiting a shear piezoelectric property. It is known that $d_{25}=-d_{14}$ and $d_{36}=0$ in a drawn sheet (film), and the piezoelectric tensor is as shown in FIG. 2(B).

PLLA exhibits a large piezoelectric property as a result of the orientation of the molecules by the drawing as well as crystallization treatment for the oriented molecules by heating treatment, and requires no poling treatment unlike other polymers such as polyvinylidene fluoride (PVDF) or piezoelectric ceramics (such as PZT). Thus, the piezoelectric property of PLLA is exhibited due to the characteristic structure of the molecules, i.e., the helical structure, unlike ferroelectrics, such as PVDF and PZT, in which the piezoelectric property is exhibited by ionic polarization. A piezoelectric made of a general ferroelectric exhibits a pyroelectric property, but PLLA exhibits no pyroelectric property. Further, it is observed that the piezoelectric constant of a material such as PVDF becomes smaller with passage of time, but PLLA can maintain its piezoelectric property in a very stable manner.

Polymer is flexible as known well, and is very unlikely to be damaged due to a large displacement unlike ceramics. Hence, for example, displacement sensors, pressure sensors, vibration sensors, and the like, each of which employs PVDF, are produced commercially. However, since PVDF exhibits a pyroelectric property as described above, a voltage is generated in a sensor employing PVDF due to a pyroelectric effect in accordance with a change in temperature, which may lead to a malfunction.

On the other hand, a similar sensor produced using PLLA is capable of sensing independently of temperature because PLLA has no pyroelectric property. Moreover, PLLA has a very low permittivity of about 2.5, so that a piezoelectric output constant (=piezoelectric g constant: $g=d/\epsilon^T$) becomes a large value, which is advantageous for sensing.

In addition, in the case of PVDF in which $\epsilon_{33}=13\times\epsilon_0$ ($\epsilon_0$ represents a permittivity in vacuum) and $d_{31}=25$ pC/N, the piezoelectric g constant thereof is $g_{31}=0.2172$ Vm/N, which is found by $g_{31}=d_{31}/\epsilon_{33}$.

On the other hand, in the case of PLLA in which piezoelectric constant $d_{14}=10$ pC/N, the piezoelectric g constant thereof is found in the following manner with the piezoelectric g constant being converted into $g_{31}$: based on $d_{14}=2d_{31}$, $d_{31}=5$ pC/N. Hence, $g_{31}=0.2258$ Vm/N is found with a similar formula. Thus, it is understood that such PLLA with piezoelectric constant $d_{14}=10$ pC/N provides sensor sensitivity comparable to the sensor sensitivity provided by PVDF. Through experiments, the inventors have obtained PLLA with $d_{14}$=about 15 to 20 pC/N, so that it is possible to produce a PLLA sensor having sensor sensitivity exceeding the sensor sensitivity provided by PVDF.

Figure 3:
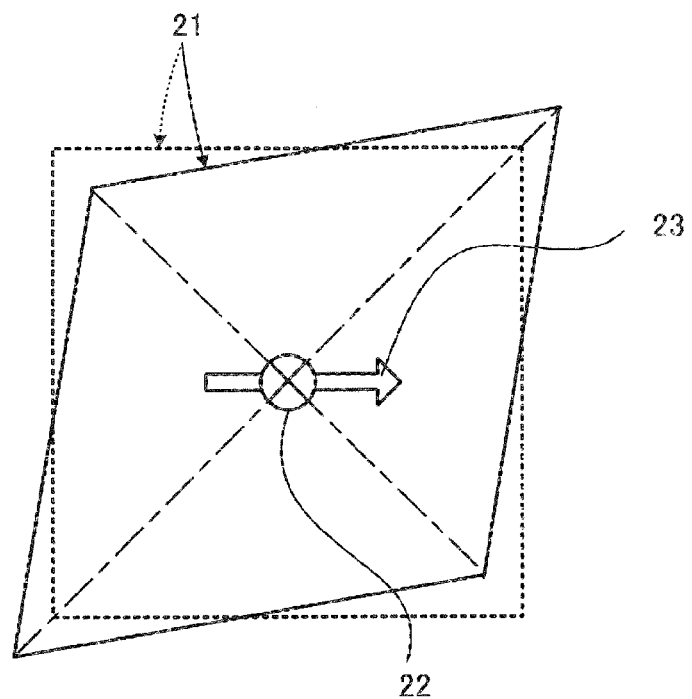
FIG. 3 shows deformation caused when applying a voltage to a PLLA film 21.

The following describes deformation taking place when a voltage is applied to a PLLA film with reference to FIG. 3. It should be noted that the description below is directed to PLLA, but deformation takes place in an opposite direction in the case of PDLA (poly-D-lactic acid), which is a mirror image isomer of PLLA, and basic properties of PLLA and PDLA are equivalent to each other.

With reference to FIG. 3, electrodes are formed on both the main surfaces of PLLA film 21, although they are not shown in the figure. A symbol 22 represents a direction of electric field and indicates that the electric field vector is directed to extend from forward to backward in the plane of sheet. An arrow 23 represents a direction of drawing performed in a film production process.

For example, when film 21 in a state indicated by a broken line is fed with the electric field, film 21 is deformed by an effect of $d_{14}$ into a state indicated by a solid line. It should be noted that this deformation is illustrated in an exaggerated manner.

Figure 4:
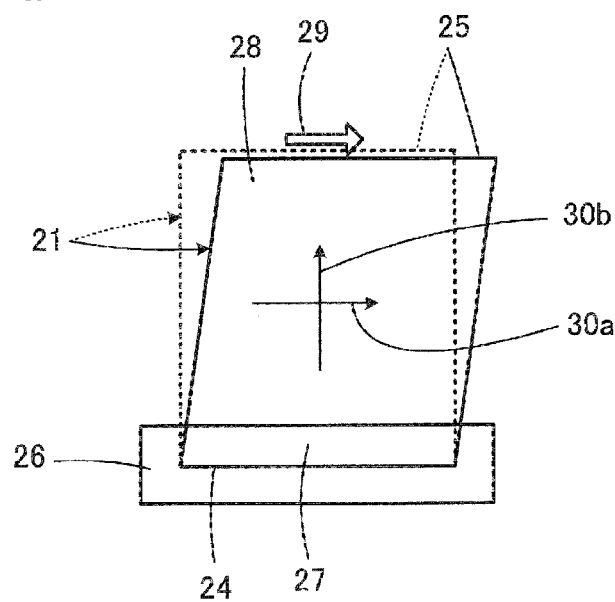
FIG. 4 shows a basic configuration of a sensor device constructed using PLLA film 21 shown in FIG. 3.

Such deformation is a basic in shear piezoelectricity. For example, film 21 shown in FIG. 3 is fixed as shown in FIG. 4. Specifically, a first side 24 of film 21 is fixed to a fixing base portion 26 to provide a fixed portion 27 of film 21 while a portion along a second side 25 opposite to first side 24 serves as a movable portion 28. In this state, when movable portion 28 is provided with force, such as frictional force, indicated by an arrow 29, film 21 is deformed in a manner similar to the deformation taking place due to the shear piezoelectricity shown in FIG. 3.

It should be noted that each of arrows 30a and 30b illustrated in film 21 corresponds to arrow 23 shown in FIG. 3, and indicates the direction of drawing. In other words, film 21 shown in FIG. 4 may be drawn in the direction of arrow 30a or the direction of arrow 30b. If output efficiency is not taken into consideration, the direction of drawing does not need to correspond to the direction of arrow 30a or the direction of arrow 30b and may be an intermediate direction between these directions.

As described above, when the frictional force indicated by arrow 29 is applied to movable portion 28 of film 21, a voltage is generated across the electrodes due to a piezoelectric effect. When the frictional force is applied in a reverse direction, the direction of displacement is reversed, with the result that the polarity of the generated voltage is changed. Moreover, when the frictional force becomes stronger, the displacement becomes larger, with the result that a large signal is obtained. It is understood that the frictional force herein is frictional force as large as frictional force provided by rubbing with the operator's finger. It should be noted that the electrodes formed on the surfaces of film 21 to face each other are not illustrated also in FIG. 4 as with FIG. 3.

A signal from a piezoelectric film such as PLLA film 21 described above represents a differentiation value with respect to displacement, and an amount of steady-state displacement is not output. To detect the steady-state displacement, the signal from the piezoelectric film is received by a charge amplifier circuit and then is integrated by an integrating circuit.

When sensing an operation or the like involving friction, detection of only differential values may suffice for certain applications. Under application of frictional force, the piezoelectric film is deformed in a repeated manner as follows: the piezoelectric film is deformed in the direction of frictional force, is slightly reverted when a degree of deformation reaches or exceeds a certain degree, and is then deformed again in the direction of frictional force. Such repeated deformation can be detected as a piezoelectric signal.

The following describes some embodiments of a sensor device implemented in accordance with the principle described above.

Figure 5A:
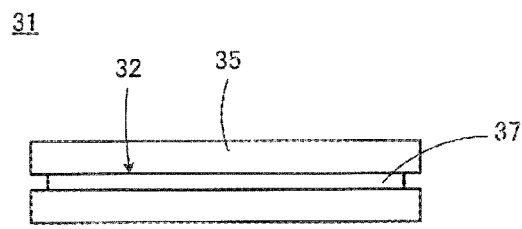
FIG. 5(A) is a top view.
Figure 5B:
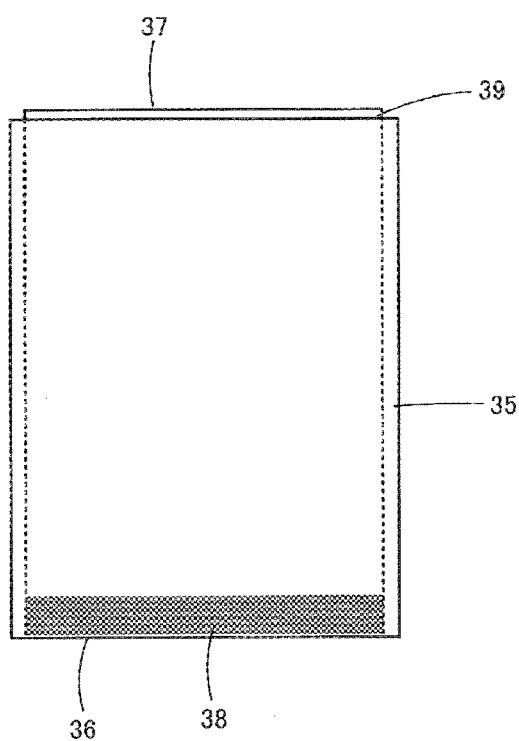
FIG. 5(B) is a front view.
Figure 5C:
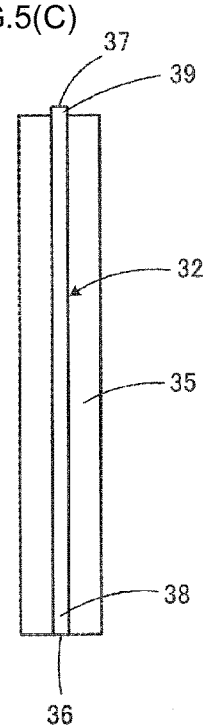
FIG. 5(C) is a right side view, each of which shows a sensor device 31 according to a first embodiment of the present invention.

With reference to FIGS. 5(A), 5(B) and 5(C), a sensor device 31 according to a first embodiment will be described.

Figure 6:
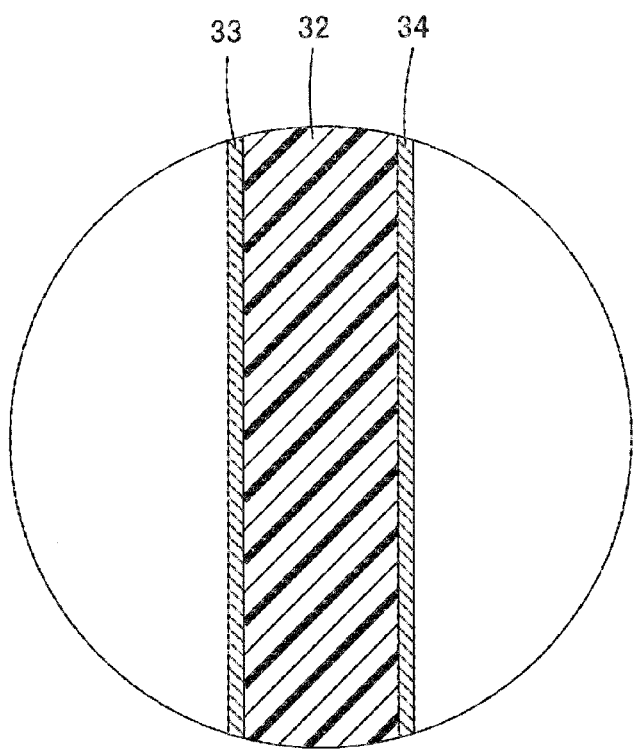
FIG. 6 is an enlarged cross sectional view showing a portion of a piezoelectric film 32 shown in FIGS. 5(A), 5(B) and 5(C).

Sensor device 31 includes a rectangular piezoelectric film 32 composed of PLLA, for example. Although not shown in FIGS. 5(A), 5(B) and 5(C), shear deformation detecting electrodes 33 and 34 are formed on the main surfaces of piezoelectric film 32 to face each other with piezoelectric film 32 interposed therebetween as shown in FIG. 6. It should be noted that the electrodes are also not illustrated in many figures used to explain second or later embodiments.

Piezoelectric film 32 is sandwiched by a holding member 35 constituted of two plates each having a predetermined thickness, whereby piezoelectric film 32 is held in a flat state. A region along a first side 36 of rectangular piezoelectric film 32, i.e., a region shaded in FIG. 5(B) is a region fixed rigidly to holding member 35 by an adhesive agent or other mechanical means. In this region, a fixed portion 38 is provided. Portions of piezoelectric film 32 other than fixed portion 38 are permitted to displace relative to holding member 35. As a result, a second side 37 of rectangular piezoelectric film 32 opposite to first side 36 serves as a free end, whereby a movable portion 39 is provided along second side 37. As understood from FIG. 5(B) and FIG. 5(C), movable portion 39 is positioned to project relative to holding member 35.

When movable portion 39 is rubbed with a finger or the like to provide frictional force in a direction parallel to the main surfaces of piezoelectric film 32, shear deformation takes place in piezoelectric film 32. Accordingly, electric charges are generated in electrodes 33 and 34 (see FIG. 6) formed on the main surfaces of piezoelectric film 32, and they can be detected as a voltage.

In sensor device 31 shown in FIGS. 5(A), 5(B) and 5(C), the direction of drawing (the direction of orientation of the chiral molecules) of piezoelectric film 32 is most preferably along the direction in which the frictional force is provided. Hence, most preferably, piezoelectric film 32 has been cut into a rectangular shape having a side extending in parallel with the direction of drawing, and fixed portion 38 is positioned along first side 36, which is one of the sides of piezoelectric film 32 having the rectangular shape.

Electrodes 33 and 34 shown in FIG. 6 may be formed on the whole of or part of the main surfaces of piezoelectric film 32. When the areas of electrodes 33 and 34 are reduced, an amount of generated electric charges becomes small and sensitivity to displacement may be also decreased, but the areas of electrodes 33 and 34 should be determined as a matter of design choice in accordance with the size of piezoelectric film 32 to be used, displacement to be provided, a type of detecting circuit to be used, or the like.

Figure 7A:
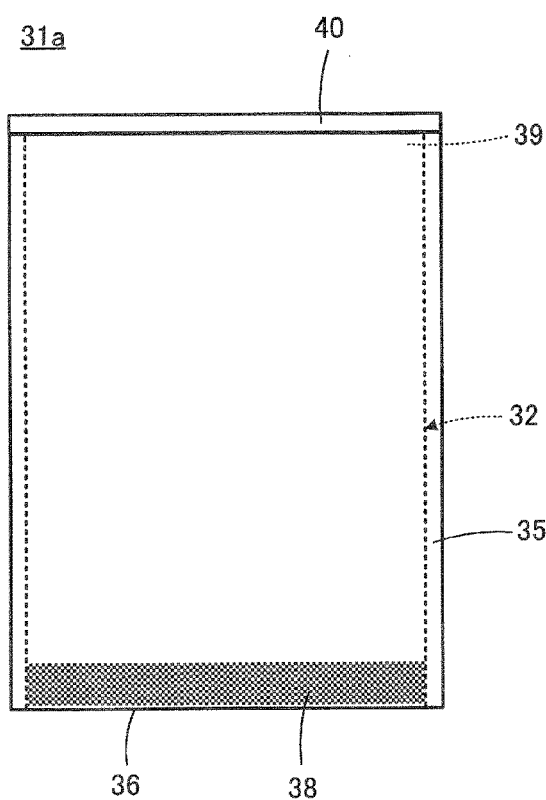
FIG. 7(A) is a front view and FIG. 7(B) is a right side view, each of which shows a sensor device 31a according to a second embodiment of the present invention.
Figure 7B:
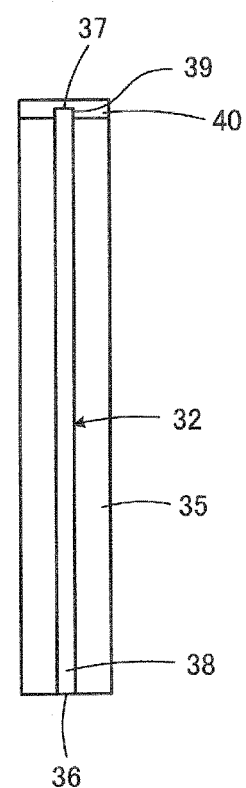
Figure 8:
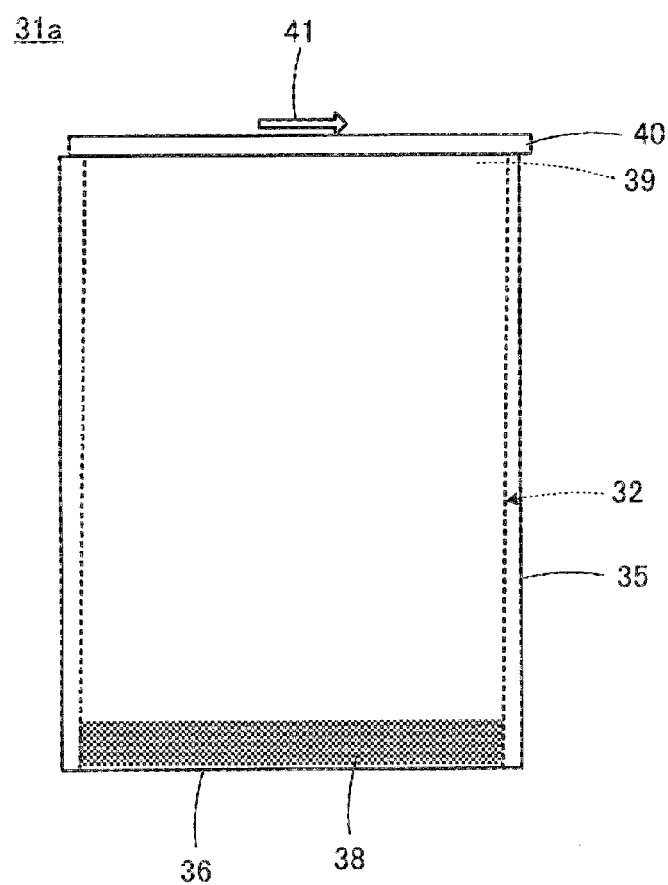
FIG. 8 is a front view showing a state of shear deformation taking place during an operation of sensor device 31a shown in FIGS. 7(A) and 7(B).

Next, with reference to FIGS. 7(A) and 7(B) and FIG. 8, a sensor device 31a according to a second embodiment will be described. In FIGS. 7(A) and 7(B) and FIG. 8, elements corresponding to the elements shown in FIGS. 5(A), 5(B) and 5(C) are given the same reference characters and are not described repeatedly.

As compared with sensor device 31 shown in FIGS. 5(A), 5(B) and 5(C), sensor device 31a shown in FIGS. 7(A) and 7(B) and FIG. 8 is characterized by further including an operation member 40. Operation member 40 is attached along second side 37 of piezoelectric film 32. Operation member 40 is fixed rigidly to piezoelectric film 32 by an adhesive agent or the like, but is not fixed to holding member 35 and is slidable along the upper end surface of holding member 35.

Moreover, operation member 40 has a width size larger than the thickness of piezoelectric film 32. In this embodiment, as understood from FIG. 7(B), operation member 40 has a width size as large as the size of the total thickness of holding member 35.

Operation member 40 provides a plane to be touched by an operator's finger for the sake of an operation so as to displace movable portion 39 of piezoelectric film 32 by the finger. FIG. 8 shows a state of displacement in an exaggerated manner when frictional force is applied to operation member 40 in a direction of arrow 41. Since piezoelectric film 32 composed of, for example, PLLA is very excellent in sensor sensitivity, even slight displacement can be detected.

As described above, with operation member 40 thus provided, the operation is facilitated and becomes comfortable and movable portion 39 of piezoelectric film 32 are avoided from being rubbed directly by the operator's finger or the like, so that piezoelectric film 32 itself is not worn out, thereby improving durability of piezoelectric film 32.

It should be noted that the shear deformation detecting electrodes formed on the main surfaces of piezoelectric film 32 are also not illustrated in FIGS. 7(A) and 7(B) and FIG. 8, but the electrodes may be formed on the whole of or part of the main surfaces of piezoelectric film 32.

Figure 10:
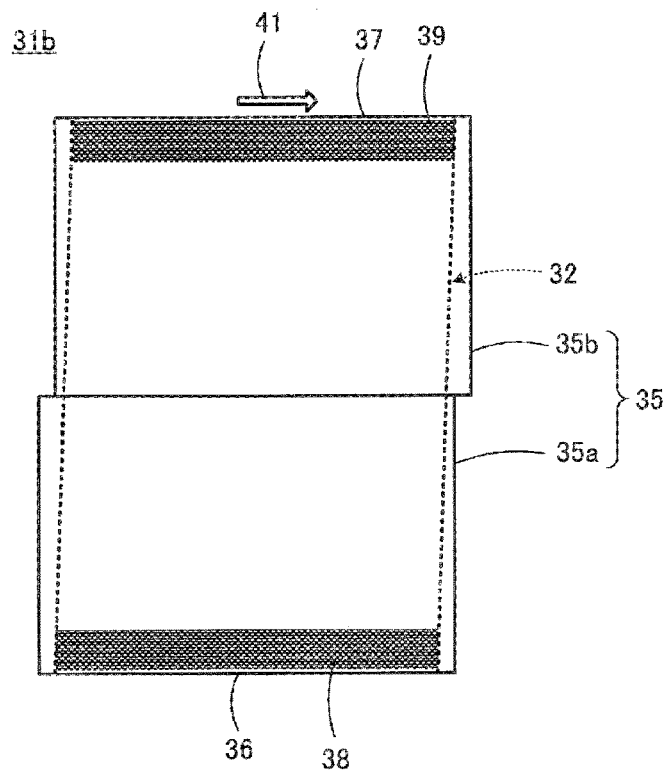
FIG. 10 is a front view showing a state of shear deformation taking place during an operation of sensor device 31b shown in FIGS. 9(A) and 9(B).

Next, with reference to FIGS. 9(A) and 9(B) and FIG. 10, a sensor device 31b according to a third embodiment will be described. In FIGS. 9(A) and 9(B) and FIG. 10, elements corresponding to the elements shown in FIGS. 5(A), 5(B) and 5(C), FIGS. 7(A) and 7(B), or FIG. 8 are given the same reference characters and are not described repeatedly.

In sensor device 31b shown in FIGS. 9(A) and 9(B) and FIG. 10, holding member 35 is divided into a lower half portion 35a and an upper half portion 35b. Regions along first side 36 and second side 37, which are opposite to each other, of piezoelectric film 32 are respectively fixed to lower half portion 35a and upper half portion 35b of holding member 35.

In this sensor device 31b, the fixed portion and movable portion in piezoelectric film 32 are determined relatively. For example, as shown in FIGS. 9(A) and 9(B), when first side 36 provides fixed portion 38, second side 37 provides movable portion 39. In this case, upper half portion 35b of holding member 35 functions as the operation member, and for example, when frictional force is applied in a direction of arrow 41 as shown in FIG. 10, shear deformation takes place in piezoelectric film 32 and this shear deformation is sensed. Conversely, first side 36 may be configured to provide the movable portion and second side 37 may be configured to provide the fixed portion, and an operation may be performed to apply frictional force to lower half portion 35a of holding member 35.

It should be noted that the shear deformation detecting electrodes formed on the main surfaces of piezoelectric film 32 are also not illustrated in FIGS. 9(A) and 9(B) and FIG. 10, but the electrodes may be formed on the whole of or part of the main surfaces of piezoelectric film 32.

Holding member 35 in each of sensor devices 31, 31a, and 31b and operation member 40 in sensor device 31a as described above may be composed of a general resin material such as PMMA (polymethylmethacrylate), PET (polyethylene terephthalate), PC (polycarbonate), PP (polypropylene), or an ABS resin (acrylonitrile butadien styrene resin). Alternatively, they may be composed of an elastomer, such as urethane or a silicone-based resin. Moreover, holding member 35 and operation member 40 may be composed of a metal as long as they are electrically insulated from electrodes 33 and 34 formed on piezoelectric film 32.

Figure 11:
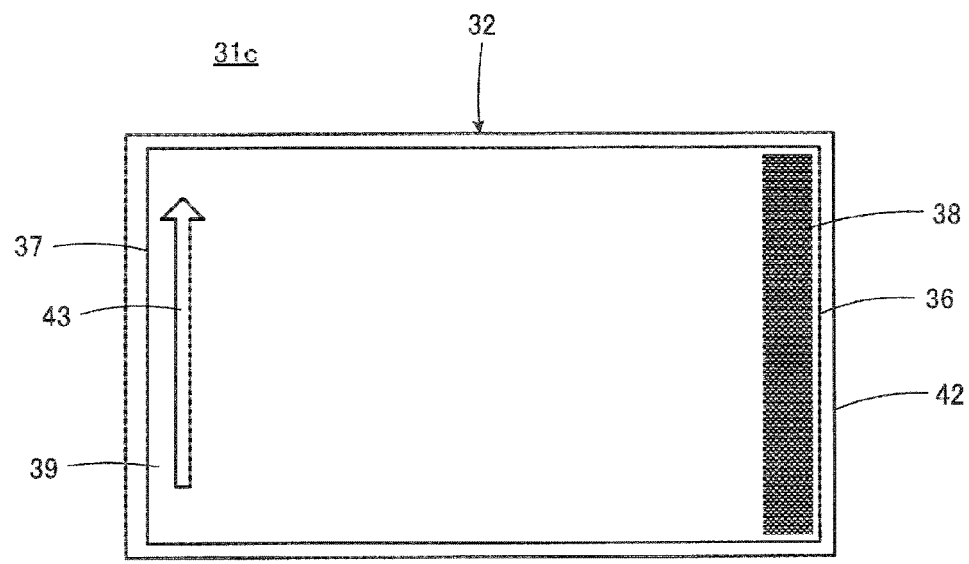
FIG. 11 is a plan view showing a sensor device 31c according to a fourth embodiment of the present invention.

Next, with reference to FIG. 11, a sensor device 31c according to a fourth embodiment will be described. In FIG. 11, elements corresponding to the elements shown in FIGS. 5(A), 5(B) and 5(C) are given the same reference characters and are not described repeatedly.

In sensor device 31c shown in FIG. 11, piezoelectric film 32 is placed on a holding member 42 and is therefore held in a flat state. A region along first side 36 of piezoelectric film 32 is fixed to holding member 42. In this region, fixed portion 38 is provided. Movable portion 39 is provided at a position along second side 37 opposite to first side 36. For example, when frictional force is applied to movable portion 39 in a direction of arrow 43, shear deformation takes place in piezoelectric film 32 and this shear deformation is sensed.

Although not shown in the figure, in sensor device 31c shown in FIG. 11, a protection film for protecting the electrode may be adhered to at least a portion of piezoelectric film 32 touched by hand such as movable portion 39. The protection film is composed of, for example, PET (polyethylene terephthalate), PEN (polyethylenenaphthalate), or PP (polypropylene).

It should be noted that the shear deformation detecting electrodes formed on the main surfaces of piezoelectric film 32 are also not illustrated in FIG. 11, but the electrodes may be formed on the whole of or part of the main surfaces of piezoelectric film 32.

Figure 12:
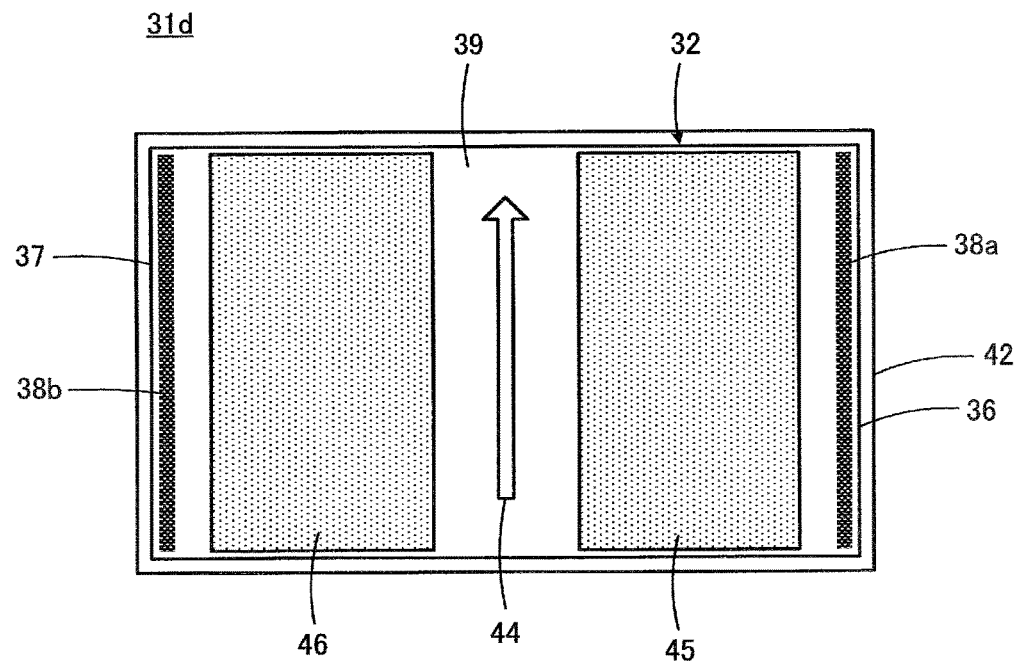
FIG. 12 is a plan view showing a sensor device 31d according to a fifth embodiment of the present invention.

Next, with reference to FIG. 12, a sensor device 31d according to a fifth embodiment will be described. Sensor device 31d shown in FIG. 12 is suitable for, for example, an application as a simple touch panel only for flick operations. In FIG. 12, elements corresponding to the elements shown in FIGS. 5(A), 5(B) and 5(C) or FIG. 11 are given the same reference characters and are not described repeatedly.

In sensor device 31d shown in FIG. 12, as with sensor device 31c shown in FIG. 11, piezoelectric film 32 is placed on holding member 42 and is therefore held in a flat state. In piezoelectric film 32, respective regions along first and second sides 36 and 37 opposite to each other are fixed to holding member 42, thereby respectively providing first and second fixed portions 38a and 38b along first and second sides 36 and 37. Movable portion 39 is positioned at an intermediate portion between first and second sides 36 and 37 in piezoelectric film 32. For example, when frictional force is applied to movable portion 39 in a direction of arrow 44, relatively minute shear deformation takes place in piezoelectric film 32.

FIG. 12 shows first and second shear deformation detecting electrodes 45 and 46 formed on piezoelectric film 32 to sense the shear deformation. In FIG. 12, only first and second electrodes 45 and 46 on the upper surface side of piezoelectric film 32 are illustrated, but first and second electrodes 45 and 46 are also formed to face first and second electrodes 45 and 46 on the upper surface side with piezoelectric film 32 being interposed therebetween in the thickness direction.

When shear deformation takes place in piezoelectric film 32, electric charges are generated in electrodes 45 and 46. On this occasion, the electric charges generated in first electrodes 45 and the electric charges generated in second electrodes 46 are opposite to each other in terms of polarity. Moreover, the polarity of the electric charges generated in each of electrodes 45 and 46 is reversed between a case of applying frictional force in the direction of arrow 44 and a case of applying frictional force in a direction opposite to arrow 44.

Further, for example, when applying frictional force in the direction of arrow 44, a ratio of an amount of electric charges generated in first electrodes 45 and an amount of electric charges generated in second electrodes 46 is changed by shifting the position provided with the frictional force to the right-hand side or the left-hand side in FIG. 12. Accordingly, the position provided with the frictional force also can be detected. It should be noted that if such detection is not particularly required, either of electrodes 45 and 46 may not be provided.

In sensor device 31d shown in FIG. 12, as with sensor device 31c shown in FIG. 11, a protection film for protecting each of electrodes 45 and 46 may be adhered on at least a portion of piezoelectric film 32 touched by hand such as movable portion 39.

Moreover, electrodes 45 and 46 are preferably transparent. In this case, examples of the material of each of electrodes 45 and 46 include: inorganic transparent conductive materials such as ITO and ZnO; or organic transparent conductive materials containing polyaniline or polythiophene as their main components. It should be noted that when electrodes 45 and 46 are not required to be transparent, each of electrodes 45 and 46 can be formed by sputtering or vapor deposition of a metallic material such as aluminum or can be formed by printing of silver paste or the like.

It should be noted that the explanation about electrodes 45 and 46 described above also applies to a sensor device other than sensor device 31d shown in FIG. 12.

Figure 13A:
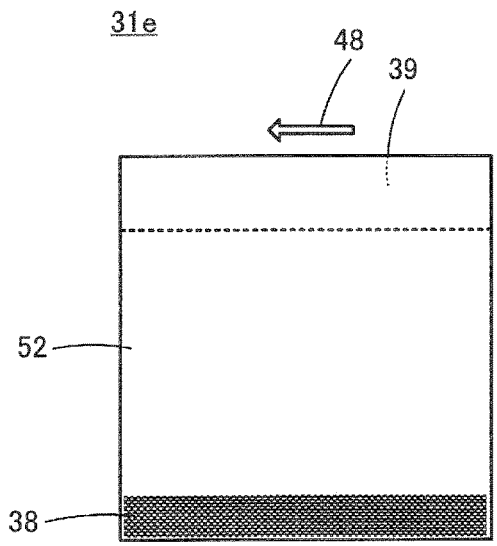
FIG. 13(A) is a front view and FIG. 13(B) is a right side view, each of which shows a sensor device 31e according to a sixth embodiment of the present invention.
Figure 13B:
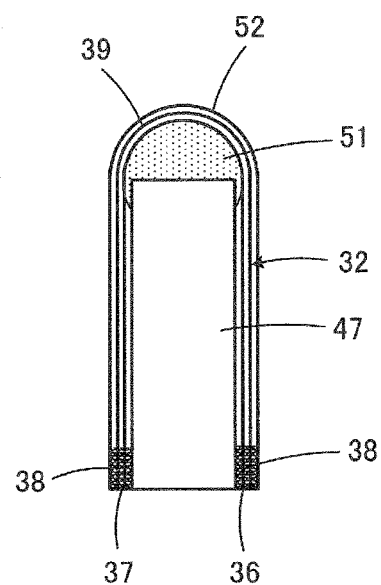
Figure 14:
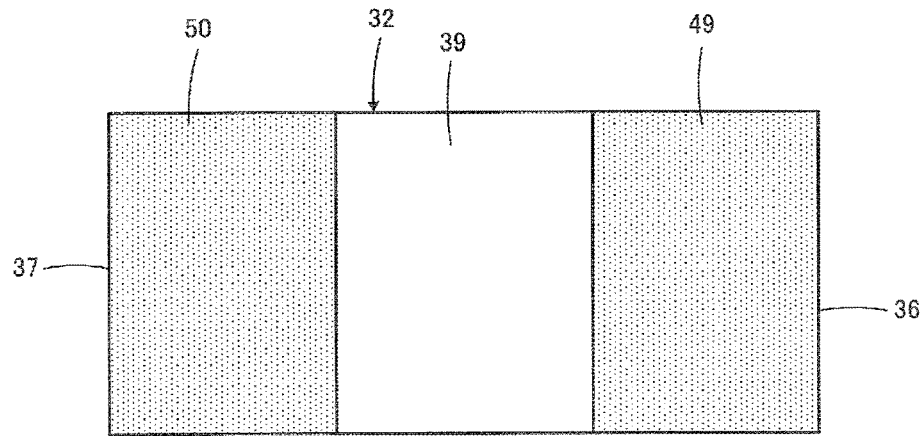
FIG. 14 is a plan view showing, in an expanded manner, a piezoelectric film 32 shown in FIGS. 13(A) and 13(B).

Next, with reference to FIGS. 13(A) and 13(B) and FIG. 14, a sensor device 31e according to a sixth embodiment will be described. In FIGS. 13(A) and 13(B) and FIG. 14, elements corresponding to the elements shown in FIGS. 5(A), 5(B) and 5(C) are given the same reference characters and are not described repeatedly.

Sensor device 31e has the following features.

As shown in FIGS. 13(A) and 13(B), piezoelectric film 32 is brought into a folded state by curving it at an intermediate portion between first and second sides 36 and 37, and this state is held by a holding member 47. Here, regions along first and second sides 36 and 37, opposite to each other, of piezoelectric film 32 serve as fixed portions 38, which are fixed to holding member 47 by an adhesive agent or the like. Movable portion 39 is positioned at the intermediate portion between first and second sides 36 and 37 in piezoelectric film 32, i.e., the curved, folded portion.

When force is applied to movable portion 39 in a direction of, for example, arrow 48 as shown in FIG. 13(A), relatively minute shear deformation takes place in piezoelectric film 32.

FIG. 14 shows first and second shear deformation detecting electrodes 49 and 50 formed on piezoelectric film 32 to sense the shear deformation. In FIG. 14, only first and second electrodes 49 and 50 on the upper surface side of piezoelectric film 32 are illustrated, but first and second electrodes 49 and 50 are also formed to face first and second electrodes 49 and 50 on the upper surface side with piezoelectric film 32 being interposed therebetween in the thickness direction.

When shear deformation takes place in piezoelectric film 32, electric charges are generated in electrodes 49 and 50. On this occasion, as with sensor device 31d shown in FIG. 12, the electric charges generated in first electrodes 49 and the electric charges generated in second electrodes 50 are opposite to each other in terms of polarity. Moreover, the polarity of the electric charges generated in each of electrodes 49 and 50 is reversed between a case of applying frictional force in a direction of arrow 48 and a case of applying frictional force in a direction opposite to arrow 48.

As shown in FIGS. 13(A) and 13(B), it is preferable to provide an elastic body 51 at an inner circumference side relative to the curved, folded portion of piezoelectric film 32. This is to maintain the curved shape of movable portion 39 serving as the operation portion.

Moreover, it is preferable to adhere a protection film 52 onto the outer surface of piezoelectric film 32. This is to protect electrodes 49 and 50.

In this sensor device 31e, either of electrodes 49 and 50 may be omitted.

According to sensor device 31e described with reference to FIGS. 13(A) and 13(B) and FIG. 14 described above, the curved, intermediate portion of piezoelectric film 32 provides a relatively wide operation plane, whereby a special operation member is not required to attain a facilitated and comfortable operation, advantageously.

Figure 15:
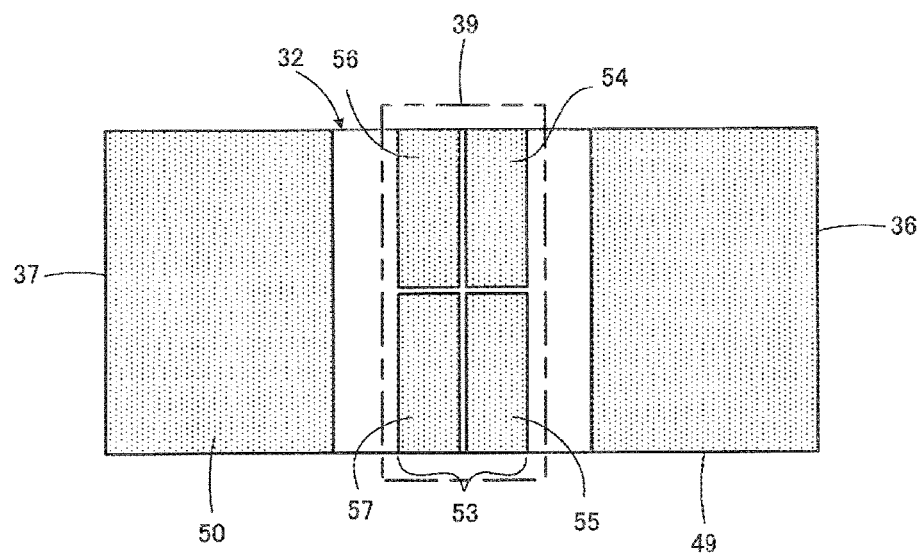
FIG. 15 illustrates a seventh embodiment of the present invention and is a plan view of the expanded state of piezoelectric film 32 to show a modification of an electrode pattern shown in FIG. 14.

FIG. 15 illustrates a seventh embodiment of the present invention so as to show a modification of the electrode pattern shown in FIG. 14. In FIG. 15, elements corresponding to the elements shown in FIG. 14 are given the same reference characters and are not described repeatedly.

Piezoelectric film 32 shown in FIG. 15 is used in sensor device 31e having the structure shown in FIGS. 13(A) and 13(B). Here, according to piezoelectric film 32 shown in FIG. 15, as with piezoelectric film 32 shown in FIG. 14, shear deformation detecting electrodes 49 and 50 are formed, thereby attaining sensing of shear deformation in piezoelectric film 32 caused by applying frictional force to movable portion 39 in the direction of arrow 48 as shown in FIG. 13(A) as with sensor device 31e described with reference to FIGS. 13(A) and 13(B) and FIG. 14.

Particularly, in this embodiment, protection film 52 is essential which is adhered at least on the outer surface of the folded portion of piezoelectric film 32. When the folded portion of piezoelectric film 32 is pressed externally, protection film 52 acts to cause extension deformation in the longitudinal direction (leftward/rightward direction in FIG. 15) at movable portion 39 of piezoelectric film 32 due to a bimorph effect provided by protection film 52 and piezoelectric film 32.

Further, after the pressing, elastic body 51 shown in FIGS. 13(A) and 13(B) acts to restore the curved shape of movable portion 39 serving as the operation portion.

As shown in FIG. 15, extension/compression deformation detecting electrodes 53 are formed at movable portion 39 positioned at the intermediate portion between first and second sides 36 and 37, opposite to each other, of piezoelectric film 32. For example, each extension/compression deformation detecting electrode 53 is divided into four, such as a first portion 54, a second portion 55, a third portion 56, and a fourth portion 57.

As described above, when the folded portion of piezoelectric film 32 is pressed externally, extension deformation takes place at movable portion 39 of piezoelectric film 32 in the longitudinal direction (leftward/rightward direction in FIG. 15) due to the bimorph effect. On this occasion, assuming that the drawing direction is along the longitudinal direction, voltages generated in first portion 54 and fourth portion 57 and voltages generated in second portion 55 and third portion 56 in extension/compression deformation detecting electrode 53 are opposite to each other in terms of polarity.

Extension/compression deformation detecting electrode 53 may be divided into four on each of or one of the main surfaces of piezoelectric film 32. In the latter case, i.e., in the case where extension/compression deformation detecting electrode 53 is divided into four on one of the main surfaces, a uniform electrode is formed on the other main surface to face commonly all the four divided portions. When the uniform electrode is formed, a circuit is formed to connect first portion 54 and fourth portion 57 in series, and connect second portion 55 and third portion 56 in series, and extracting conductors are connected to one of first portion 54 and fourth portion 57 and one of second portion 55 and third portion 56, thereby detecting the voltages. On the other hand, when extension/compression deformation detecting electrode 53 is divided into four in each of the main surfaces, parallel connection or series connection can be made on the circuit if extracting conductors are respectively connected to first to fourth portions 54 to 57.

As such, in sensor device 31e shown in FIGS. 13(A) and 13(B), when piezoelectric film 32 having the electrode pattern shown in FIG. 15 is used, an operation of running a finger or the like thereon (friction or rubbing) and an operation of pressing can be detected separately.

Figure 16:
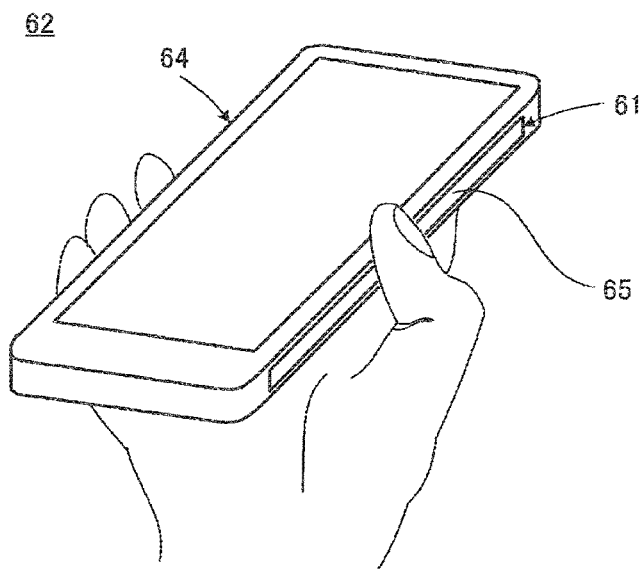
FIG. 16 is a perspective view showing a smartphone 62 to which a sensor device 61 according to the present invention is applied.
Figure 17:
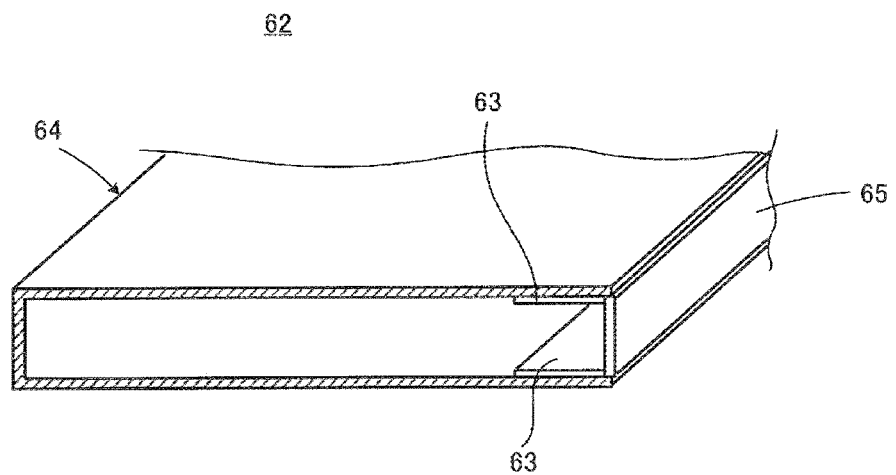
FIG. 17 is a partial perspective view of smartphone 62 to show an attachment structure of sensor device 61 shown in FIG. 16.

FIG. 16 shows a smartphone 62 to which a sensor device 61 according to the present invention is applied as a rubbing sensor. Piezoelectric films 63 included in sensor device 61 are attached along a case 64 of smartphone 62 as shown in FIG. 17. Although details are not shown in the figure, piezoelectric films 63 are attached to cause shear deformation when operation member 65 is shifted slightly relative to case 64 by applying frictional force to operation member 65 provided on the side surface of case 64. Then, an output voltage resulting from the shear deformation is extracted via electrodes (not shown) formed on piezoelectric film 63. In accordance with this voltage, the application of frictional force to operation member 65 is detected.

Each of piezoelectric films 63 can be sufficiently provided as long as there is a space of about 200 μm even when a protection film not shown in the figure is adhered thereon, and therefore requires substantially no occupying space in case 64.

In FIG. 17, two piezoelectric films 63 are respectively attached to the upper surface wall and lower surface wall of case 64, but one piezoelectric film 63 may be attached to only one of the upper surface wall and lower surface wall of case 64.

Moreover, operation member 65 may be provided at a location other than the side surface of case 64, such as a vicinity of an edge of the lower surface wall of case 64.

Figure 18:
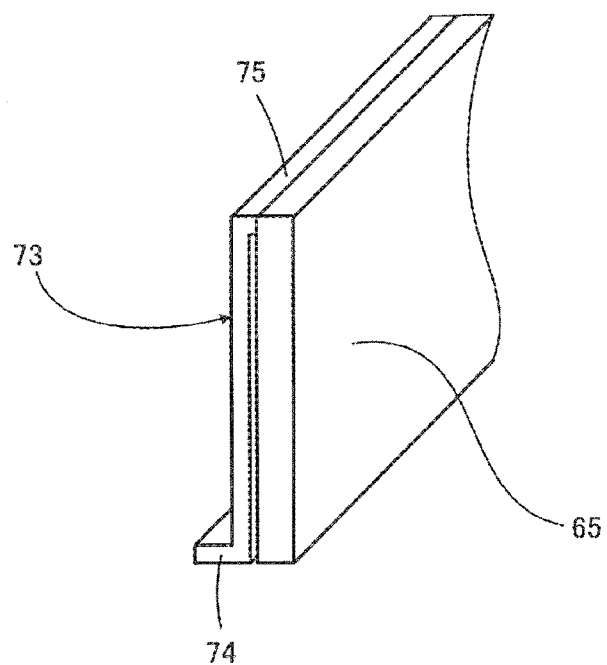
FIG. 18 is a partial perspective view showing a modification of an attachment structure of a sensor device 71 to the smartphone.
Figure 19:
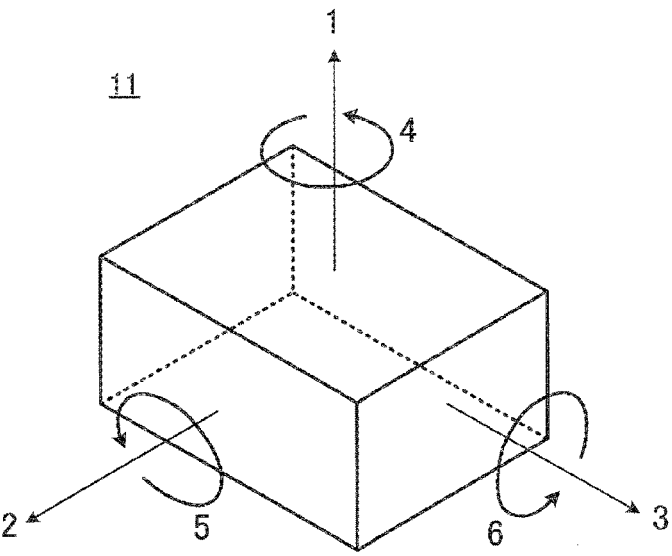
FIG. 19 illustrates a relation among a direction of drawing axis, a direction of electric field, and a direction of strain in a piezoelectric film 11 composed of polylactic acid.

FIG. 18 shows a modification of the attachment structure of the sensor device to the smartphone. A sensor device 71 shown in FIG. 18 is attached to, for example, case 64 shown in FIG. 17. A piezoelectric film 73 included in sensor device 71 is bent in the form of N, and has one end serving as a fixed portion 74 fixed to case 64. The other end of piezoelectric film 73 serves as a movable portion 75 and is attached to operation member 65 shown in FIG. 17. When operation member 65 is shifted slightly relative to case 64 by applying frictional force to operation member 65, shear deformation takes place in piezoelectric film 73. Then, via electrodes (not shown) formed on piezoelectric film 73, an output voltage resulting from the shear deformation can be extracted.

As understood from the application of the sensor device to the smartphone as illustrated above, the sensor device according to the present invention can be advantageously incorporated as an HMI (human machine interface). Moreover, the sensor device according to the present invention can be incorporated advantageously as an HMI in devices other than mobile communication devices such as the smartphone. Examples of such devices include a tablet PC or a portable gaming device.

Moreover, in the description above, PLLA has been illustrated as the material of the piezoelectric film having a shear piezoelectric property, but PDLA can also be used. Further, examples of other materials for the piezoelectric film having a shear piezoelectric property include: poly-y-methyl glutamate, poly-y-benzyl glutamate, cellulose, collagen, polypropylene oxide, and the like.

REFERENCE SIGNS LIST 11, 32, 63, 73: piezoelectric film
21: PLLA film
24, 25, 36, 37: side
27, 38, 38a, 38b, 74: fixed portion
28, 39, 75: movable portion
31, 31a, 31b, 31c, 31d, 31e, 61, 71: sensor device
33, 34, 45, 46, 49, 50: shear deformation detecting electrode
35, 42, 47: holding member
40, 65: operation member
51: elastic body
52: protection film
53: extension/compression deformation detecting electrode
62: smartphone

The invention claimed is:

1. A sensor device comprising:
a piezoelectric film which contains, as a main component, a chiral polymer including chiral molecules as a unit and in which a main orientation direction of said chiral molecules is in a direction parallel to main surfaces of the piezoelectric film, said piezoelectric film having a fixed portion at which displacement of said piezoelectric film is fixed and a movable portion; and
shear deformation detecting electrodes constructed to extract an output voltage resulting from shear deformation of said piezoelectric film caused by the displacement of said movable portion, said shear deformation detecting electrodes being located on the main surfaces of said piezoelectric film such that said shear deformation detecting electrodes face each other with at least a portion of said piezoelectric film being interposed therebetween.

2. The sensor device according to claim 1, wherein said piezoelectric film has a rectangular shape having a side extending in parallel with said main orientation direction of said chiral molecules.

3. The sensor device according to claim 2, wherein said fixed portion is positioned along a first side of said piezoelectric film and said movable portion is positioned along a second side opposite to said first side.

4. The sensor device according to claim 3, further comprising an operation member attached along said second side of said piezoelectric film.

5. The sensor device according to claim 4, wherein said operation member has a width larger than a thickness of said piezoelectric film so as to provide a portion that can be displaced by a finger of an operator.

6. The sensor device according to claim 2, wherein said fixed portion is positioned along each of first and second sides of said piezoelectric film, said first and second sides being opposite to each other, and said movable portion is positioned at an intermediate portion between said first and second sides in said piezoelectric film.

7. The sensor device according to claim 5, further comprising a holding member constructed to hold said piezoelectric film in a flat state.

8. The sensor device according to claim 6, further comprising a holding member constructed to hold said piezoelectric film in a folded state with said piezoelectric film being curved at said intermediate portion between said first and second sides.

9. The sensor device according to claim 8, further comprising a protection film adhered at least on an outer surface of a folded portion of said piezoelectric film, said protection film acting to cause extension deformation at said movable portion of said piezoelectric film through a bimorph effect provided by said protection film and said piezoelectric film when said folded portion of said piezoelectric film is pressed.

10. The sensor device according to claim 9, further comprising an extension/compression deformation detecting electrode constructed to extract an output voltage resulting from deformation at said movable portion of said piezoelectric film.

11. The sensor device according to claim 8, further comprising an elastic body disposed at an inner circumferential side relative to said folded portion of said piezoelectric film.

12. The sensor device according to claim 1, wherein said piezoelectric film is in an N shape.

13. The sensor device according to claim 1, wherein said piezoelectric film is composed of polylactic acid.

14. The sensor device according to claim 1, further comprising a holding member constructed to hold said piezoelectric film in a flat state.

15. An electronic device, wherein the sensor device of claim 1 is incorporated as a human machine interface.

* * * * *